METHOD OF FABRICATING A LAMINATED PRINTED CIRCUIT STRUCTURE

Filed June 15, 1961

INVENTOR
JAMES CASEMENT
BY Orrin M. Haugen
ATTORNEY

United States Patent Office 3,234,060
Patented Feb. 8, 1966

3,234,060

METHOD OF FABRICATING A LAMINATED PRINTED CIRCUIT STRUCTURE

James Casement, St. Paul, Minn., assignor to Sperry Rand Corporation, New York, N.Y., a corporation of Delaware Filed June 15, 1961, Ser. No. 117,344
2 Claims. (Cl. 156—3)

Figure 1:
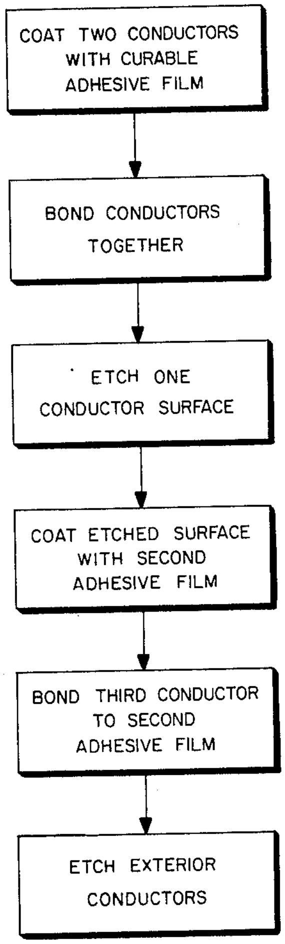

The present invention is concerned generally with multi-layer printed circuitry, and more particularly to extremely thin circuitry of this type and the method of preparation thereof.

In the preparation of magnetic memory arrays, which arrays include magnetic memory elements arranged in spaced relationship, one from another, these units frequently being arranged in oppositely disposed relationship along a multi-layer printed circuitry assembly, careful and accurate conductor registration is essential for proper operation. In addition to the accuracy required in conductor arrangement, mechanical rigidity of the laminated circuitry array is also a requisite.

In the past, multi-layer laminated circuitry or printed circuitry has been utilized wherein a pre-formed film layer is utilized as in the insulator between adjacent conductive layers. In this technique, an adhesive film is employed to secure the conductor to the insulator, and the thickness developed is normally far in excess of that which is developed in connection with the technique of the present invention. The bond to the insulator is normally the weakest bond in the system. In addition, any variance in condition responsive characteristics of the individual insulating layers such as thermal expansion and the like is eliminated, in the present invention. The adhesive layer will accordingly contribute to mechanical rigidity as well as to the maintenance of proper registration of the individual conductors or conductive layers. The present invention eliminates certain problems from the preparation of thin multi-layer printed circuitry elements.

Referring to the cross sectional dimension of the conductors, it is imperative that the conductor be thinner than the skin depth of the field at the operating frequency being utilized. The skin depth for copper may be computed from the formula:

$$D_s=\frac{2.6}{\sqrt{f}}$$

wherein $D_s$ is the skin depth in mils and $f$ is the signal frequency in megacycles.

In accordance with the present invention, a thin, multi-layer printed circuitry assembly is prepared by coating a metallic layer with a separating layer of a laminating adhesive, a second metallic layer being superimposed over the separating film and secured thereto to form composite laminae. Utilizing one of the metallic or conductor layers as a backing element, a circuitry pattern is then etched onto one of the metallic conductors. When more than two conductors are desired in the assembly, a second layer of adhesive is placed along the etched surface, and a third metallic layer is bonded thereto. Again, after the adhesive film has been substantially cured, one of the outer conductors is utilized as a mechanical backing for the system and the other metallic layer is etched as desired. This technique may be repeated until a sufficient number of metallic layers are prepared, and at that time, a final step which includes the etching of both outside layers, as desired is conducted. Thus, a multi-layer circuitry assembly is built up from a series of individual alternate conductor and insulator layers, each layer being securely bonded to the other prior to etching. Inasmuch as the insulator films are formed from identical materials, there is no relative displacement of the individual conductor areas, one from another, when various different ambient conditions are encountered.

Therefore, it is an object of the present invention to provide an improved ultra-thin, multi-layer printed circuitry assembly wherein a sound bond is established between the individual layers, and wherein proper registery of the individual layers is initially established during preparation and maintained throughout.

It is a further object of the present invention to provide a technique for the preparation of an ultra-thin, multi-layer printed circuitry assembly wherein one of the initial thin conductor layers is employed throughout the process as a mechanical backing for the remaining laminae during the individual operations encountered in the preparation technique.

It is still another object of the present invention to provide an improved technique for the preparation of multi-layer printed circuitry wherein extremely thin, mechanically sound laminate structures are fabricated.

Figure 2:
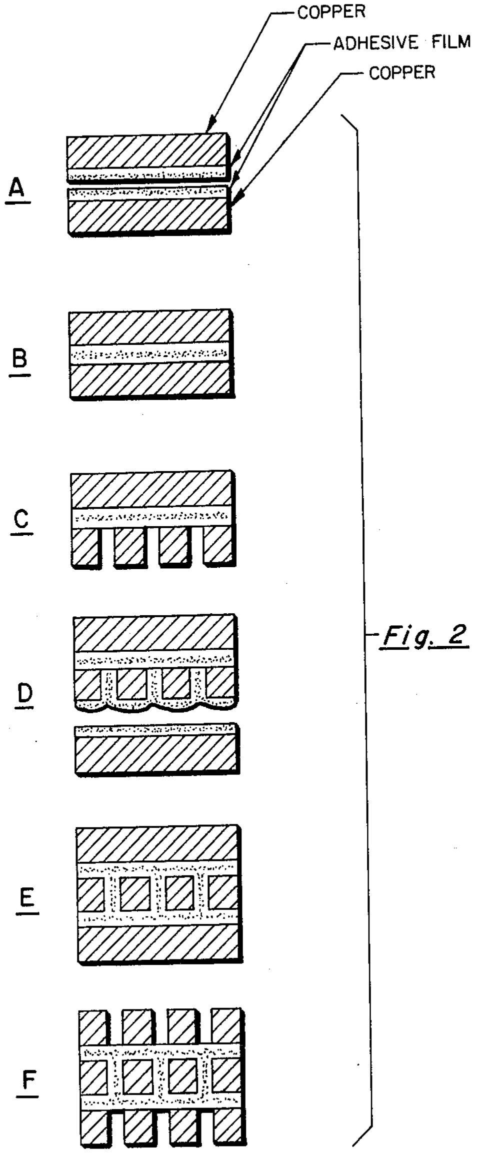

Other and further objects of the present invention will become apparent to those skilled in the art upon a study of the following specification, appended claims and accompanying drawings wherein:

FIG. 1 is a flow diagram illustrating a preferred sequence for the various operations carried out in a preferred preparation program in accordance with the present invention; and FIG. 2 is a series of vertical, sectional views of conductor assemblies in their various steps of preparation.

In the preferred process of the present invention, a pair of relatively thin conductor layers are coated along one surface thereof with a uniform film of an adhesive coating or separating film. The conductor is preferably copper having a thickness of about ½ mil, and the adhesive film is preferably a laminating insulative adhesive curable by heat or other techniques. Polyster adhesives of this type may be made extremely resistant to flow or creep prior to curing. Adhesives of this type are commercially available, particularly useful material of this type being that certain polyester adhesive sold by E. I. du Pont de Nemours and Company, Inc. under their code number Du Pont 46971. For purposes of preparation of thin circuitry, the adhesive separating film is applied uniformly over the metallic surface to a thickness of about ½ mil or less. A ⅛ mil separating film may be utilized and is advantageously employed, a draw-down bar or coating knife being advantageously employed in the preparation of the raw separating film. This operation is illustrated in FIG. 2 of the drawing, particularly in illustration A. As will be appreciated that the figures are not drawn to scale and for purposes of clarity and due to limitations in draftsmanship, certain dimensions have been exaggerated. The two layers are then permanently bonded or laminated together by drying and heat-laminating the adhesive bond. For most purposes a temperature of about 325° F. for a period of 10 minutes is deemed sufficient for curing. The assembly, after bonding, is shown in illustration B of FIG. 2, this being ready for etching on one side only with the second or unetched metallic layer being utilized as a backing plate. Conventional photo-etching techniques are utilized, there being no unusual problems created by the preparation of this assembly. After etching, the assembly appears as is shown in illustration C of FIG. 2. Subsequent to the first etching operation, a second adhesive film is applied to the etched surface, and a third conductor is adhesively bonded to the prepared lamina, the third conductor being disposed adjacent to the etched conductor surface. The adhesive utilized is the same as that previously employed, as is the conductive metallic layer. This operation is shown in illustrations D and E of FIG. 2. It will be observed that the two bonding layers, when cured, provide a homogeneous film between the individual adhesive layers. After the third conductor layer has been bonded, each of the exterior conductor layers may be etched away in a preferred circuit pattern as desired. While the showing in illustration F of FIG. 2 indicates that the etching provides conductors having an axis perpendicular to the plane of the paper, it will be appreciated that the preferred practice has the axes running transversely, one to another, along mutually adjacent conductor layers. It will be appreciated that as the exterior metallic copper layers are being etched, registry to the inner layers is firmly held inasmuch as the previous bonding has already been accomplished. In other words, the resist is exposed in the exterior copper films while proper registry is maintained to the inner layers.

In addition to the maintaining of proper registry, the thin electrical conductive array which is prepared in accordance with the technique described hereinabove provides for superior electrical coupling between individual components of a magnetic memory assembly, as well as for fast, uniform and reliable response of any magnetic element disposed adjacent thereto. Inasmuch as the cross-sectional dimension of the circuitry assembly is extremely thin, the thickness of the conductors need not exceed the skin depth of the field at the frequencies utilized. The technique further provides for proper and convenient handling of the system inasmuch as one of the initial copper layers is employed as a backing layer or support for the remaining layers or portions of the system.

While certain other techniques may be advantageously employed, it will be appreciated that the steps illustrated herein are for purposes of illustration only and are not to be otherwise construed as a limitation on the scope and spirit of the present invention.

What is claimed is:

1. The method of fabricating a laminated printed circuit structure which comprises the steps of (a) coating one major surface of first and second conductor blanks with a thin film of a certain insulating adhesive layer,
(b) placing said conductor blanks together with said adhesive coated surfaces in contact,
(c) curing said certain adhesive to a mechanically rigid film thereby bonding said first and second conductor blanks along said major surfaces to form a first thin laminate assembly,
(d) forming a circuit pattern in said first blank,
(e) coating the surface of the circuit pattern formed from said first blank with a second layer of said certain insulating adhesive,
(f) placing a third conductive blank in contact with said second layer of adhesive,
(g) curing said second adhesive layer to form a rigid mechanical film thereby bonding said third conductive blank to said first laminate assembly and thence
(h) etching circuit patterns in the outer conductive blanks.

2. The method of fabricating a laminated printed circuitry structure which comprises the steps of (a) coating the major surface of first and second conductor plates with a thin film of a certain insulating adhesive layer,
(b) placing said conductor plates together with the adhesively coated surfaces in contact,
(c) bonding said first and said second conductor plates along said major surfaces through curing of said certain adhesive to form a mechanically rigid film,
(d) forming a circuit pattern in said first conductor plate,
(e) coating said plate having said circuit pattern with at least one additional insulating adhesive layer,
(f) placing an additional conductor layer in contact with said additional insulating adhesive,
(g) bonding said additional conductor layer to said additional adhesive layer by curing said additional adhesive,
(h) etching a circuit pattern in said additional conductor layer,
(i) repeating steps (e) through (h) above to form a rigid laminate assembly of as many conducting plates as desired, and thence
(j) etching a circuit pattern in said second conductor plate.

References Cited by the Examiner

UNITED STATES PATENTS

| | | | |
|---|---|---|---|
| 2,765,250 | 10/1956 | Williams | 161—231 X |
| 2,849,298 | 8/1958 | Werberig | 156—3 |
| 3,006,795 | 10/1961 | Brickell | 156—3 |
| 3,010,863 | 11/1961 | Coe et al. | 156—3 |
| 3,138,503 | 6/1964 | Taraud | 156—3 |
| 3,148,098 | 9/1964 | Beste | 156—18 X |
| 3,155,561 | 11/1964 | Rubens et al. | |

FOREIGN PATENTS

| | | |
|---|---|---|
| 586,804 | 11/1959 | Canada. |

EARL M. BERGERT, *Primary Examiner.*

HAROLD ANSHER, ALEXANDER WYMAN, JACOB STEINBERG, *Examiners.*